(12) United States Patent
Kida

(10) Patent No.: US 6,680,611 B2
(45) Date of Patent: Jan. 20, 2004

(54) LOCAL SIGNAL-SUPPLYING DEVICE FOR NMR SPECTROMETER

(75) Inventor: Yoshiki Kida, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/053,895

(22) Filed: Jan. 18, 2002

(65) Prior Publication Data

US 2002/0109502 A1 Aug. 15, 2002

(51) Int. Cl.[7] .................................. G01V 3/00
(52) U.S. Cl. ........................ 324/318; 324/309
(58) Field of Search ........................ 324/318, 319, 324/315, 309, 322; 455/324, 86

(56) References Cited

U.S. PATENT DOCUMENTS 5,987,309 A  * 11/1999 Adachi et al. ............... 455/86
6,385,443 B1 *  5/2002 Lee et al. ..................... 455/324

FOREIGN PATENT DOCUMENTS

| EP | 0 133 799    | * | 8/1984  |
| EP | WO 00/24104  | * | 4/2000  |
| JP | 07-094920    | * | 9/1993  |
| JP | 09-223932    | * | 2/1996  |
| JP | 10-165392    | * | 12/1996 |

OTHER PUBLICATIONS

Fourier Transform N.M.R. Spectroscopy, Chapter 6, Derek Shaw, Elsevier Scientific Publishing Company, 1976, pp. 121–145.

* cited by examiner

Primary Examiner—Diego Gutierrez
Assistant Examiner—Brij B. Shrivastav
(74) Attorney, Agent, or Firm—Webb Ziesenheim Logsdon Orkin & Hanson, P.C.

(57) ABSTRACT

A local signal supply device for an NMR spectrometer comprises a local signal generator, the output of which is divided into the same number of portions as there are local signal-selecting switches. The local signal-selecting switches independently select necessary local signals and supply them to corresponding resonance frequency signal generators.

11 Claims, 5 Drawing Sheets

LOCAL SIGNAL-SUPPLYING DEVICE FOR NMR SPECTROMETER

BACKGROUND OF THE INVENTION

1. Field of the Invention

The present invention relates to the technical field of NMR spectrometers for examining the structures of substances using nuclear magnetic resonance phenomena and, more particularly, to the technical field of devices for supplying local signals used to generate plural resonance frequency signals.

2. Description of Related Art

A conventional NMR spectrometer is essentially constructed as shown in FIG. 4. This instrument has a magnet 1 within which a sample 2 is placed. An RF pulsed signal of a resonance frequency corresponding to the magnetic field strength is applied to the sample 2 to induce a nuclear magnetic resonance phenomenon. In this case, the resonance frequency signal is generated by mixing a local signal and an intermediate frequency signal within a resonance frequency signal generator 5. The local and intermediate frequency signals are generated by a local signal generator 3 and an intermediate frequency signal generator 4, respectively. The resonance frequency signal is appropriately amplified by an amplifier 6 and fed via an input/output switching device 7 to a detector 8 consisting of a detection coil. The resonance frequency signal is applied as an RF signal to the sample 2 from the detector 8. The sample 2 produces a signal of the resonance frequency because of a nuclear magnetic resonance phenomenon. The produced signal is picked up by the detector 8. The output signal from the detector 8 is sent to a preamplifier 9 via the input/output switching device 7 and amplified. Then, the signal is converted into audio frequency by a receiver 10 and converted into digital form by an A/D converter 11. The resultant digital signal is accepted into a computer 12 which analyzes the signal. Thus, the sample 2 is analyzed. In this manner, the structure of the substance is examined by the NMR spectrometer.

It is customary to apply plural RF signals that are different in frequency, amplitude, or phase to a sample simultaneously or in succession, in order to examine the structure of the substance more closely. Accordingly, another conventional NMR spectrometer uses plural (five in the illustrated example) resonance frequency signal generators 5 to generate plural resonance frequency signals as shown in FIG. 5. To obtain plural resonance signals, there must be the same number of local signal generators 3 (five in the illustrated example) and the same number of intermediate frequency signal generators 4 as there are the resonance frequency signal generators 5.

Normally, the amplifier 6, the input/output switching device 7, the detector 8, and the preamplifier 9 have their respective fixed operating frequency ranges. Therefore, they need to be used separately according to frequency. Consequently, a router 13 is placed ahead of the amplifier 6 to use these components separately according to different frequencies.

The conventional local signal-supplying device designed in this way and used with an NMR spectrometer needs the same number of local signal generators 3 as there are the resonance frequency signal generators 5. Therefore, the number of the local signal generators 3 is increased, thus increasing the cost.

SUMMARY OF THE INVENTION

It is an object of the present invention to provide a local signal-supplying device which is for use with an NMR spectrometer and can be fabricated at reduced cost by reducing the number of local signal generators.

This object is achieved in accordance with the teachings of the present invention by a local signal-supplying device which is used with an NMR spectrometer and which comprises: local signal generators for generating local signals; and resonance frequency signal generators for generating resonance frequency signals using the local signals. RF signals obtained based on the resonance frequency signals from the resonance frequency signal generators are applied to a sample to induce nuclear magnetic resonance phenomena in the sample. The local signal-supplying device is characterized in that the resonance frequency signal generators are plural in number and that there are further provided local signal-distribution devices for dividing the local signals generated by the local signal generators into the same number of portions as there are the resonance frequency signal generators and supplying the local signals to the resonance frequency signal generators, respectively.

In one feature of the present invention, the aforementioned local signal generators generate local signals that are spaced in frequency.

In another feature of the present invention, the aforementioned local signal generators are fewer in number than the resonance frequency signal generators.

In a further feature of the present invention, the local signal-distribution devices are at least equal in number to the corresponding local signal generators.

In a still other feature of the present invention, there are provided local signal-switching devices as devices for selecting a certain one of the plural local signals distributed by the local signal-distribution device and supplying the selected signal to the resonance frequency signal generators.

In yet another feature of the present invention, the local signal-switching devices are at least equal in number to the corresponding resonance frequency signal generators.

In an additional feature of the present invention, the local signal-distribution devices and the local signal-switching devices together form one local signal-distributing-and-switching device.

In still another feature of the present invention, the local signal-distribution device and the local signal-switching device are incorporated in the resonance frequency signal generators.

In a still further feature of the present invention, the local signal-distribution devices incorporated in the plural resonance frequency signal generators are connected in cascade such that at least one output of the local signal-distribution device of one resonance frequency signal generator forms inputs to the local signal-distribution device incorporated in the next one of the resonance frequency signal generators.

In a yet further feature of the present invention, in the last one of the cascaded resonance frequency signal generators, output from the immediately previous local signal-distribution device is directly applied to a corresponding terminal of the incorporated local signal-switching device.

Other objects and features of the invention will appear in the course of the description thereof, which follows.

DESCRIPTION OF THE PREFERRED EMBODIMENTS

Figure 1:
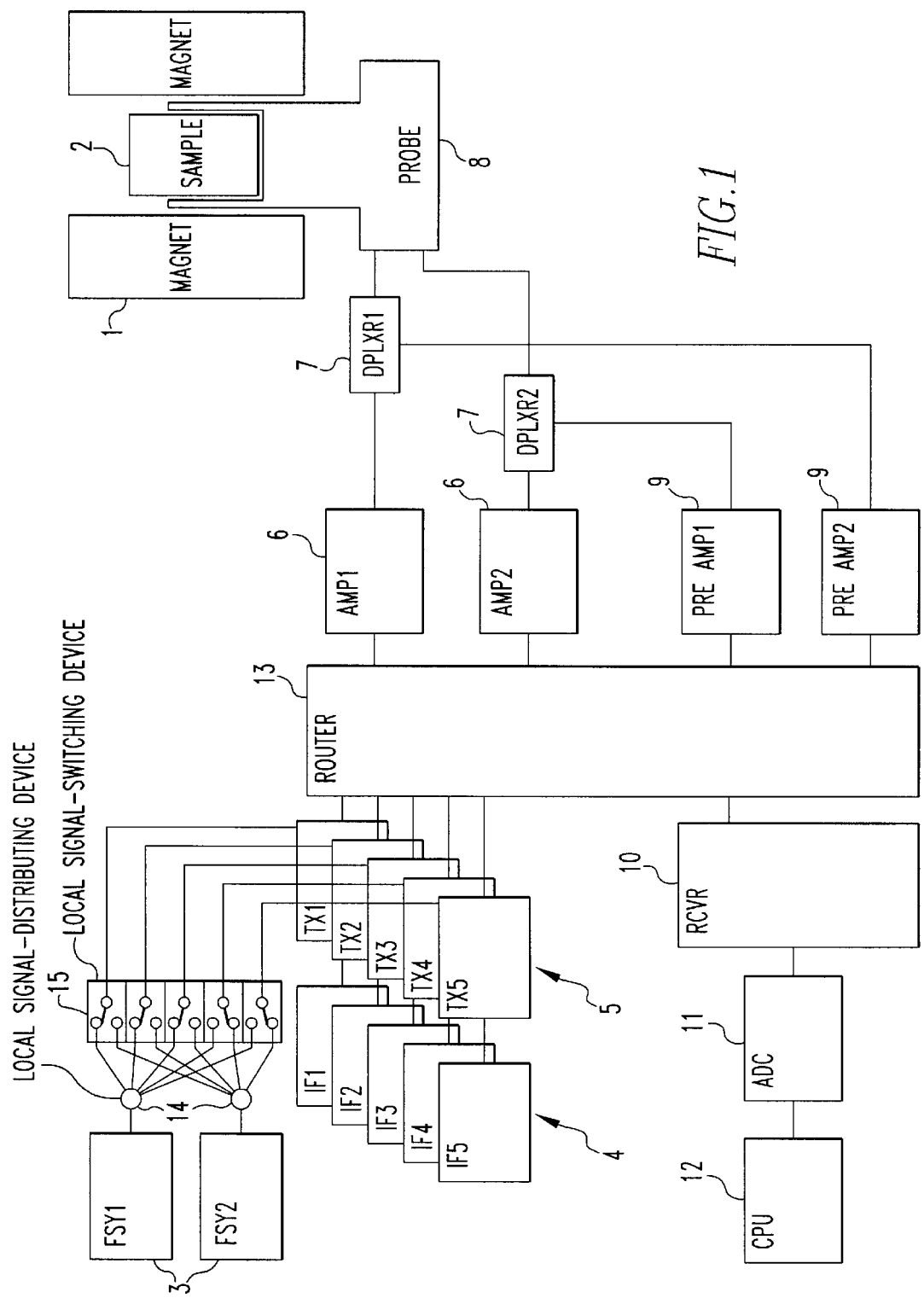
FIG. 1 is a block diagram of a local signal-supplying device for use with an NMR spectrometer, the device being built in accordance with the present invention.

Referring to FIG. 1, there is shown a local signal-supplying device for use with an NMR spectrometer, the device being built in accordance with one embodiment of the present invention. In the following description of the various embodiments of the present invention, like components are indicated by like reference numerals in the various figures including those used to describe the conventional structures. Those components that are described once will not be repeatedly described in detail later.

This local signal-supplying device for use with the NMR spectrometer can make use of the following principle. If plural RF signals to be delivered are close to each other in frequency (specifically, if the difference between the RF signal frequencies is so small that the difference can be varied by the intermediate frequency signal generator 4), the RF signals can use a common local signal.

In particular, as shown in FIG. 1, in this example of local signal-supplying device, local signal generators 3 are fewer in number than resonance frequency signal generators 5. In the illustrated example, the resonance frequency signal generators 5 are five in number, whereas the local signal generators 3 are two in number. The local signals from the local signal generators 3 are set to frequencies that are relatively widely spaced from each other. Each local signal generator 3 is fitted with a local signal-distributing device 14, which divides the local signal from the corresponding local signal generator 3 into the same number of portions as there are the resonance frequency signal generators 5.

Also, there are provided local signal-selecting devices 15 corresponding to the resonance frequency signal generators 5, respectively. These local signal-selecting devices 15 select necessary local signals from the local signals distributed by the local signal-distribution devices 14 and supply the selected signals to the corresponding resonance frequency signal generators 5.

In the local signal-supplying device constructed in this way and used with the NMR spectrometer, a local signal produced by one local signal generator 3 is divided into the same number of portions as there are the local signal-selecting devices 15 by the corresponding local signal-distribution devices 14, and these portions are supplied to the local signal-selecting devices 15, respectively. Similarly, a local signal produced by any other local signal generator 3 is divided into the same number of portions as there are the local signal-selecting means 15 by the corresponding local signal generator 3, and these portions are supplied to the local signal-selecting devices 15, respectively.

Figure 5:
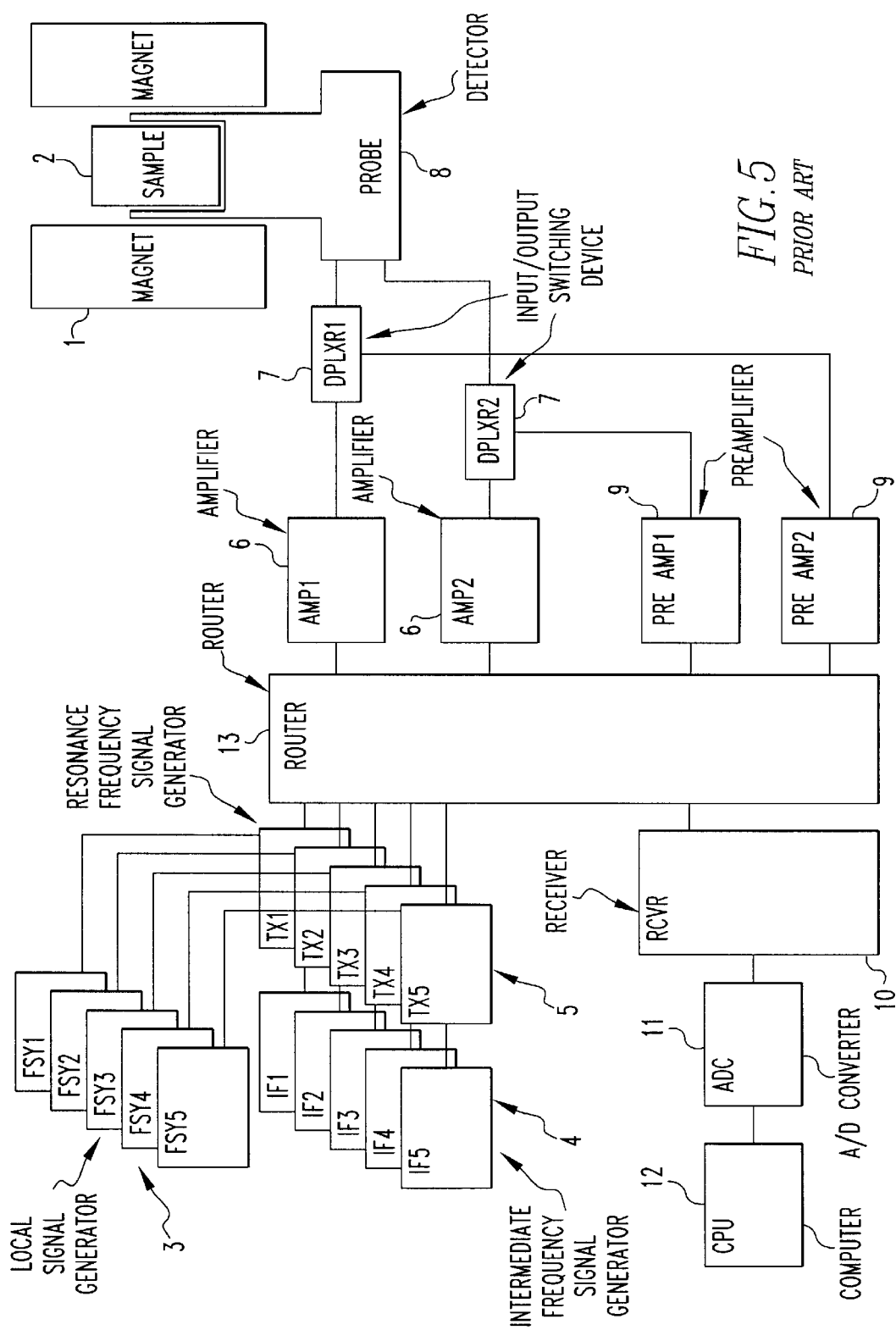
FIG. 5 is a schematic view of another conventional NMR spectrometer.

The local signal-selecting devices 15 independently select necessary local signals and supply them to the corresponding resonance frequency signal generators 5. RF signals are then obtained in the same way as in the conventional configuration already described in connection with FIG. 5.

In this example of local signal-supplying device for use with an NMR spectrometer, a local signal from each local signal generator 3 is divided into plural portions and used. The number of the local signal generators 3 can be reduced accordingly. Hence, cost savings can be accomplished.

Furthermore, the local signal-selecting devices 15 make it possible to supply local signals having relatively widely spaced frequencies to the resonance frequency signal generators 5. This example of NMR spectrometer is similar to the conventional instrument already described in connection with FIG. 5 in other respects, including operation and advantages.

It is to be noted that the present invention is not limited to the above embodiments as to the number of the local signal generators 3 and the number of resonance frequency signal generators 5 as long as the number of local signal generators 3 is set less than the number of the resonance frequency signal generators 5. Their numbers can be set at will according to the number of RF signals necessary for the purpose of the NMR spectrometer. In this case, the intermediate frequency signal generators 4 and the local signal-selecting devices 15 are set equal in number to the resonance frequency signal generators 5. The local signal-distribution devices 14 are set equal in number to the local signal generators 3.

Figure 2:
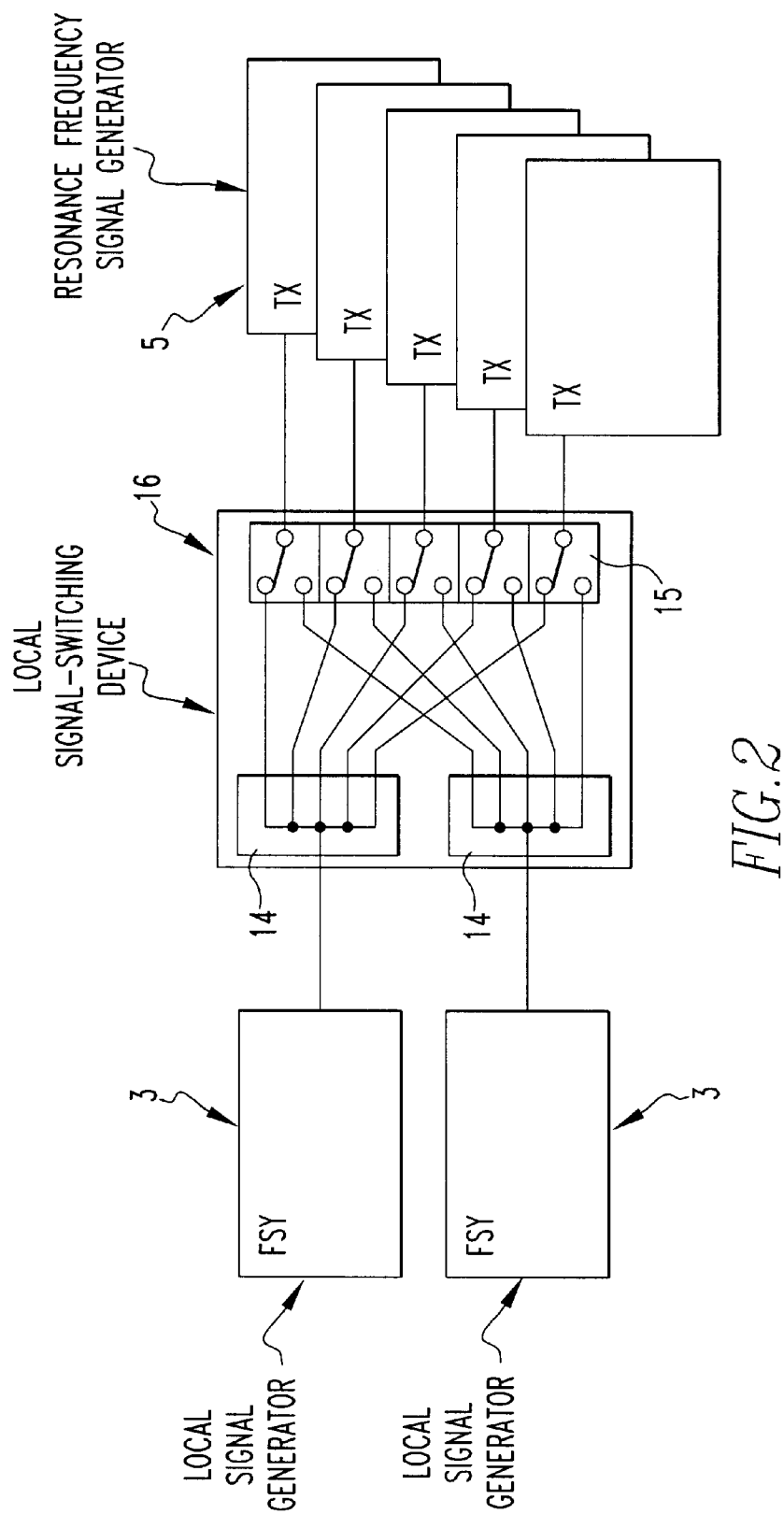
FIG. 2 is a schematic view of another embodiment of the present invention.

FIG. 2 shows another embodiment of the present invention. In the embodiment described previously in connection with FIG. 1, the local signal-distributing devices 14 and local signal-switching devices 15 are mounted separately. In a local signal-supplying device according to this embodiment, local signal-distributing devices 14 and local signal-switching devices 15 are combined into a local signal-distributing-and-switching device 16 as shown in FIG. 2. The number of the local signal-distributing devices 14 is equal to the number of the local signal generators 3. The number of the resonance frequency signal generators 5 is equal to the number of the local signal-switching devices 16. Local signals from the local signal generators 3 are supplied to the local signal-distributing-and-switching device 16 which selects and distributes the local signals to the resonance frequency signal generators 5. Since the local signal-distributing devices 14 and local signal-switching devices 15 are combined into one local signal-distributing-and-switching device 16 in this way, the local signal-supplying device can be designed more compactly. The structure and advantages of this NMR spectrometer are similar to those of the instrument illustrated in FIG. 1 in other respects, including structure, operation, and advantages.

Figure 3:
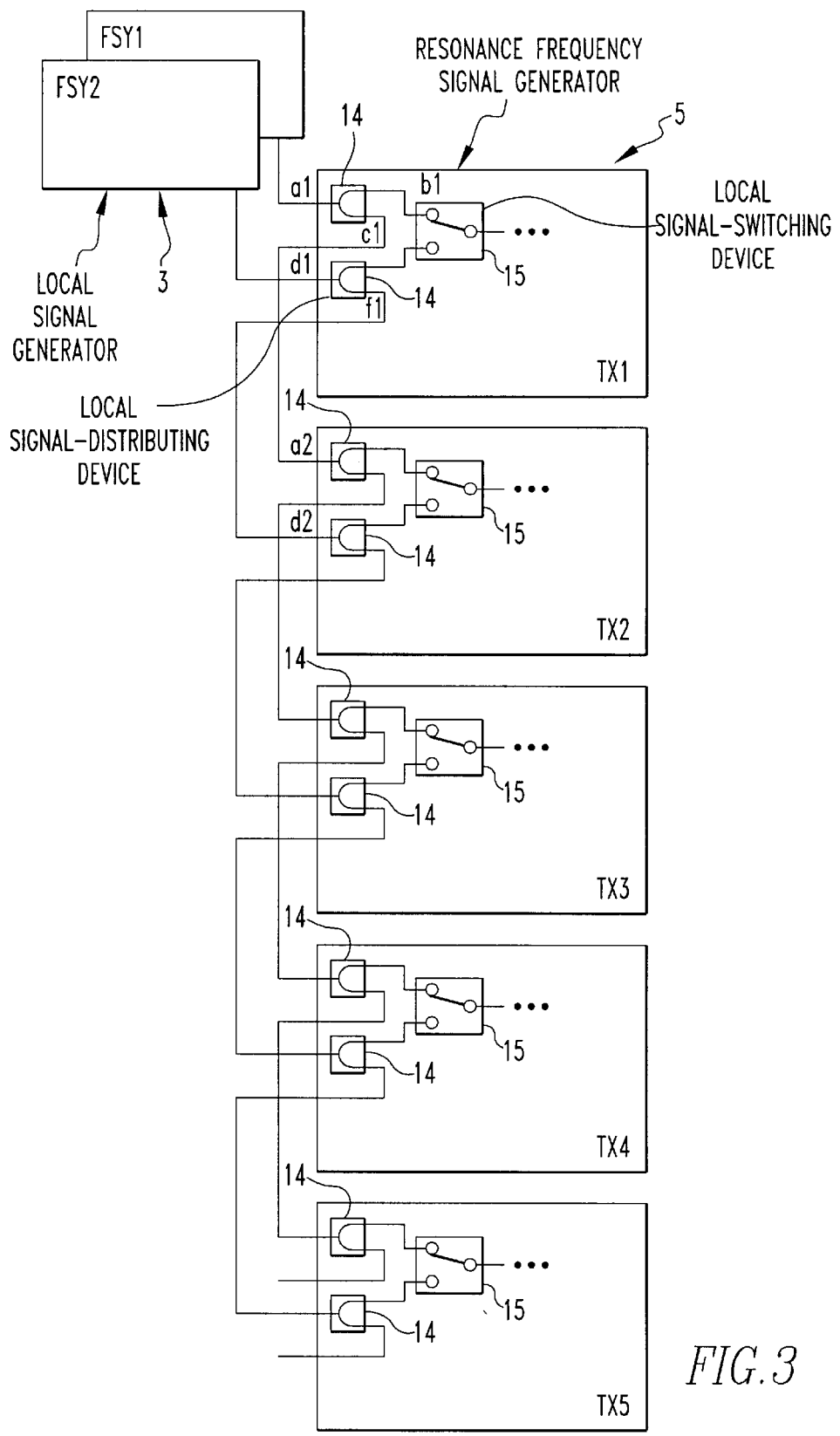
FIG. 3 is a schematic view of a further embodiment of the present invention.
Figure 4:
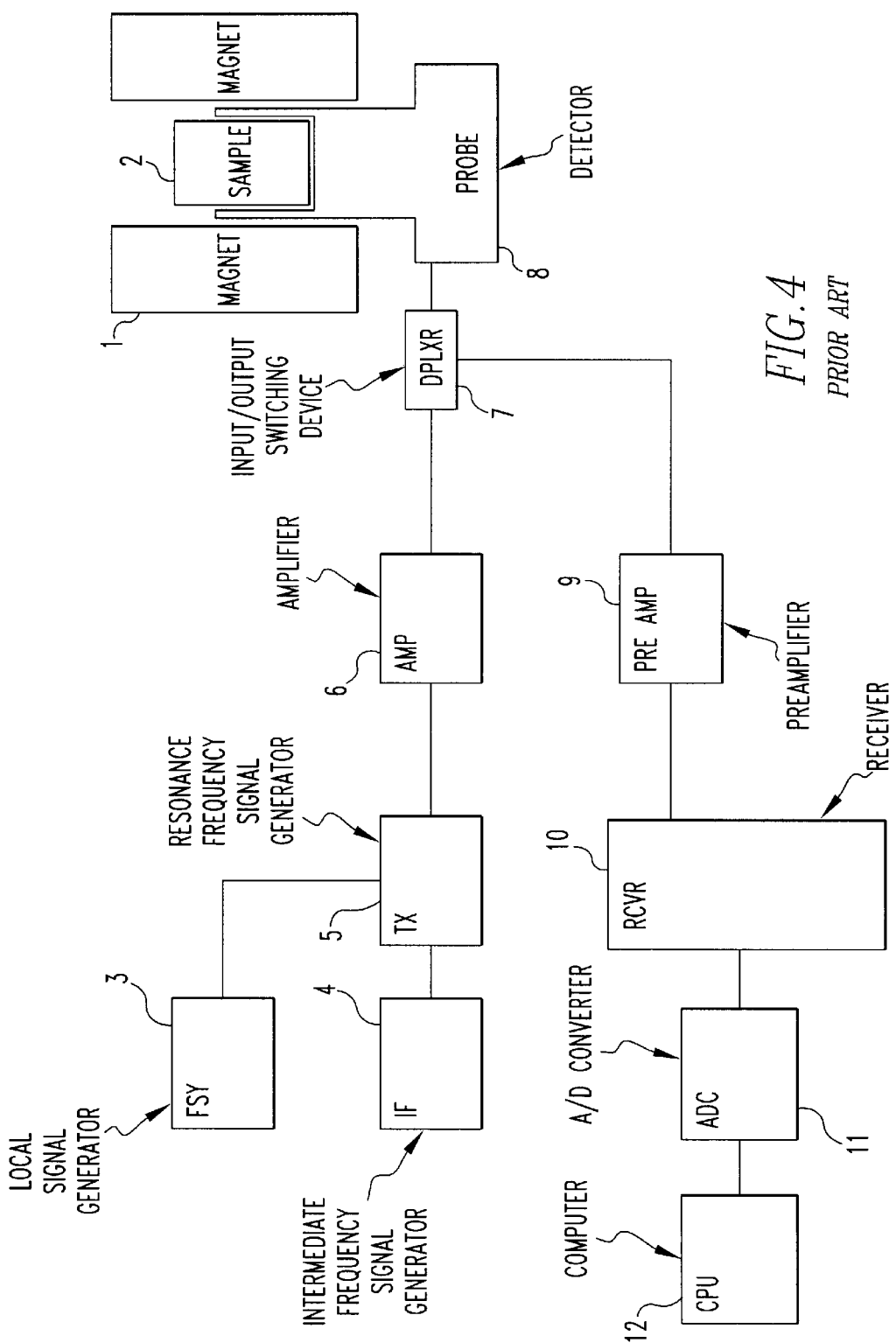
FIG. 4 is a block diagram of a conventional NMR spectrometer.

Referring to FIG. 3, there is shown a further embodiment of the present invention. In the embodiment described previously in connection with FIG. 1, the local signal-distributing devices 14 and local signal-switching devices 15 are mounted separately and outside of the resonance frequency signal generators 5. In this example of local signal-supplying device, local signal-distributing devices 14 and local signal-switching devices 15 are incorporated in each resonance frequency signal generator 5, as shown in FIG. 3. In each resonance frequency signal generator 5, the same number of local signal-distributing devices 14 as there are the local signal generators 3 and one local signal-switching device 15 are mounted. Each local signal-distributing device 14 has one input and two outputs. The local signal-distributing devices 14 of each resonance frequency signal generator 5 are connected in cascade in such a way that one output of one local signal-distributing device 14 is the input to the next local signal-distributing device 14.

In particular, in each resonance frequency signal generator 5, the inputs of the local signal-distributing devices 14 are supplied with local signals from their respective local signal generators 3. The local signals distributed by the local signal-distributing devices 14 are supplied to their respective terminals of the local signal-switching devices 15 from one respective output. The local signals distributed by each local signal-distributing device 14 in one resonance frequency signal generator 5 are supplied to the inputs of the signal-distributing devices 14 of the next resonance frequency signal generator 5 from respective other outputs. In this way, the local signal-distributing devices 14 are so connected that local signals are supplied similarly regarding the following resonance frequency signal generators 5.

Since the local signal-distributing devices 14 and the local signal-switching device 15 are incorporated in each resonance frequency signal generator 5 in this way, the local signal-supplying device can be designed more compactly, in the same way as the embodiments described above.

In the last resonance frequency signal generator 5, the local signal-distributing devices 14 may be omitted, and the other outputs of the local signal-distributing devices 14 of the immediately previous resonance frequency signal generator 5 may be directly connected with their respective terminals of the local signal-switching device 15 of the last resonance frequency signal generator 5. This example of NMR spectrometer is substantially identical in other structures and advantages to the embodiment described previously in connection with FIG. 1.

As can be understood from the description provided thus far, with a local signal-supplying device built in accordance with the present invention and used with an NMR spectrometer, local signal-distribution means divide a local signal from one local signal generator into plural portions and supply them to plural resonance frequency signal generators. Therefore, the local signal generators can be made fewer in number than heretofore. Cost savings can be accomplished.

Having thus described my invention with the detail and particularity required by the Patent Laws, what is desired protected by Letters Patent is set forth in the following claims.

What is claimed is:

1. A local signal-supplying device for use with an NMR spectrometer, comprising:

local signal generators for generating local signals;

resonance frequency signal generators for generating resonance frequency signals using said local signals;

said NMR spectrometer being designed to apply RF signals obtained based on the resonance frequency signals from the resonance frequency signal generators to a sample to induce nuclear magnetic resonance phenomena in the sample;

said resonance frequency signal generators being plural in number; and local signal-distribution means for dividing the local signals generated by the local signal generators into the same number of portions as there are said resonance frequency signal generators and supplying the local signals to said resonance frequency signal generators, respectively.

2. A local signal-supplying device for use with an NMR spectrometer as set forth in claim 1, wherein said local signal generators generate local signals that are spaced in frequency.

3. A local signal-supplying device for use with an NMR spectrometer as set forth in claim 1, wherein said local signal generators are fewer in number than said resonance frequency signal generators.

4. A local signal-supplying device for use with an NMR spectrometer as set forth in claim 1, wherein said local signal-distribution means are at least equal in number to the corresponding local signal generators.

5. A local signal-supplying device for use with an NMR spectrometer as set forth in claim 1, wherein there are provided local signal-switching means as means for selecting a certain one of the plural local signals distributed by the local signal-distribution means and supplying the selected signal to said resonance frequency signal generators.

6. A local signal-supplying device for use with an NMR spectrometer as set forth in claim 5, wherein said local signal-switching means are at least equal in number to the corresponding resonance frequency signal generators.

7. A local signal-supplying device for use with an NMR spectrometer as set forth in claim 5, wherein said local signal-distribution means and said local signal-switching means together form one local signal-distributing-and-switching means.

8. A local signal-supplying device for use with an NMR spectrometer as set forth in claim 5, wherein said local signal-distribution means and said local signal-switching means are incorporated in said resonance frequency signal generators.

9. A local signal-supplying device for use with an NMR spectrometer as set forth in claim 8, wherein the local signal-distribution means incorporated in said plural resonance frequency signal generators are connected in cascade such that at least one output of the local signal-distribution means of one resonance frequency signal generator forms inputs to the local signal-distribution means incorporated in a next one of said resonance frequency signal generators.

10. A local signal-supplying device for use with an NMR spectrometer as set forth in claim 9, wherein in a last one of said cascaded resonance frequency signal generators, output from immediately previous local signal-distribution means is directly applied to a corresponding terminal of the incorporated local signal-switching means.

11. The local signal-supplying device according to any one of claims 1 to 10, wherein the resonance frequency generators generate frequency signals by mixing said local signals with an intermediate frequency signal.

* * * * *

UNITED STATES PATENT AND TRADEMARK OFFICE
CERTIFICATE OF CORRECTION

PATENT NO. : 6,680,611 B2
DATED : January 20, 2004
INVENTOR(S) : Yoshiki Kita

It is certified that error appears in the above-identified patent and that said Letters Patent is hereby corrected as shown below:

<u>Title page,</u>
Insert: -- [30]   Foreign Application Priority Data
        Jan. 19, 2001   (JP) ……….. 2001-012046 --.

Signed and Sealed this

Eighth Day of June, 2004

JON W. DUDAS
*Acting Director of the United States Patent and Trademark Office*